US011031209B2

(12) United States Patent
Van Der Toorn

(10) Patent No.: US 11,031,209 B2
(45) Date of Patent: Jun. 8, 2021

(54) SCANNING EFFICIENCY BY INDIVIDUAL BEAM STEERING OF MULTI-BEAM APPARATUS

(71) Applicant: ASML Netherlands B.V., Veldhoven (NL)

(72) Inventor: Jan-Gerard Cornelis Van Der Toorn, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/729,211

(22) Filed: Dec. 27, 2019

(65) Prior Publication Data

US 2020/0211814 A1 Jul. 2, 2020

Related U.S. Application Data

(60) Provisional application No. 62/786,248, filed on Dec. 28, 2018.

(51) Int. Cl.
*H01J 37/24* (2006.01)
*H01J 37/147* (2006.01)
*H01J 37/28* (2006.01)

(52) U.S. Cl.
CPC ............ *H01J 37/24* (2013.01); *H01J 37/147* (2013.01); *H01J 37/28* (2013.01); *H01J 2237/1504* (2013.01)

(58) Field of Classification Search
CPC .......... H01J 37/24; H01J 37/147; H01J 37/28; H01J 2237/1504
See application file for complete search history.

(56) References Cited

U.S. PATENT DOCUMENTS 9,691,586 B2 6/2017 Ren et al.
2018/0277337 A1 9/2018 Anantha et al.

FOREIGN PATENT DOCUMENTS

TW 201133534 A 10/2011

OTHER PUBLICATIONS

International Search Report issued by the International Searching Authority in related PCT International Application No. PCT/EP2019/083956, dated Mar. 16, 2020 (4 pgs.).

(Continued)

*Primary Examiner* — Nicole M Ippolito
*Assistant Examiner* — Hanway Chang
(74) *Attorney, Agent, or Firm* — Finnegan, Henderson, Farabow, Garrett & Dunner, LLP

(57) ABSTRACT

Systems and methods of observing a sample in a multi-beam apparatus are disclosed. A multi-beam apparatus may comprise an array of deflectors configured to steer individual beamlets of multiple beamlets, each deflector of the array of deflectors having a corresponding driver configured to receive a signal for steering a corresponding individual beamlet. The apparatus may further include a controller having circuitry to acquire profile data of a sample and to control each deflector by providing the signal to the corresponding driver based on the acquired profile data, and a steering circuitry comprising the corresponding driver configured to generate a driving signal, a corresponding compensator configured to receive the driving signal and a set of driving signals from other adjacent drivers associated with adjacent deflectors and to generate a compensation signal to compensate a corresponding deflector based on the driving signal and the set of driving signals.

15 Claims, 13 Drawing Sheets

(56) References Cited

OTHER PUBLICATIONS

Sznitman, Raphael et al., "Efficient Scanning for EM Based Target Localization," International Conference on Financial Cryptography and Data Security; [Lecture notes in computer Science]; © Springer-Verlag Berlin Heidelberg, pp. 337-344 2012; XP047463878, ISBN: 978-3-642-17318-9 (4 pgs.).

Sievers, Torsten et al., "Pose Estimation of Mobile Microrobots in a Scanning Electron Microscope—*A cross-correlation based approach using ROI'S*," Proceedings of the Second International Conference on Informatics I Control, Automation and Robotics, Jan. 1, 2005, pp. 193-198, XP055674018, DOI: 10.5220/0001178201930198, ISBN: 978-972-886-531-3, pp. 195, 197; figure 5 (6 pgs.).

Zonnevylle, A.C. et al., "Multi-electron-beam deflector array," Microelectronic Engineering, Elsevier Publishers BV., Amsterdam, NL, vol. 123, Jun. 30, 2014, pp. 140-148, XP029075405, ISSN: 0167-9317, DOI: 10.1016/J.MEE.2014.06.014 (10 pgs.).

Office Action of the Intellectual Property Office of Taiwan issued in related Taiwanese Patent Application No. 108146406; dated Dec. 3, 2020 (14 pgs.).

SCANNING EFFICIENCY BY INDIVIDUAL BEAM STEERING OF MULTI-BEAM APPARATUS

CROSS-REFERENCE TO RELATED APPLICATIONS

This application claims priority of U.S. application 62/786,248 which was filed on Dec. 28, 2018, and which is incorporated herein in its entirety by reference.

FIELD

The description herein relates to charged-particle beam apparatus with one or more charged-particle beams, and more particularly, a multi-beam apparatus including individual beam steering devices.

BACKGROUND

In manufacturing processes for integrated circuits (ICs), circuit components may be inspected to ensure they are manufactured according to design and are free of defects. Pattern defects, uninvited particles (e.g., residuals), or the like, may appear on a wafer or a mask during fabrication, and may thereby reduce yield. For example, uninvited particles may be troublesome for patterns with smaller critical feature dimensions, which have been adopted to meet the more and more advanced performance requirements of IC chips.

A charged-particle (e.g., electron) beam microscope, such as a scanning electron microscope (SEM) or a transmission electron microscope (TEM), capable of resolution down to less than a nanometer, may serve as a practical tool for inspecting IC components having a feature size on a scale of, for example, sub-100 nanometers. In a SEM tool, a beam of primary electrons having a relatively high energy is decelerated to land on a sample at a relatively low landing energy and is focused to form a probe spot thereon. Due to this focused probe spot of primary electrons, secondary electrons will be generated from the surface. By scanning the probe spot over the sample surface and collecting the secondary electrons, pattern inspection tools may obtain an image of the sample surface. Multiple charged-particle beams may be used to increase the inspection throughput; however, productivity and efficiency of beam current usage may be compromised, rendering the inspection tools inadequate for their desired purpose.

Thus, related art systems face limitations in, for example, efficient usage of beam current and maintaining individual beam quality of a multiple charged-particle beam apparatus. Further improvements in the art are desired.

SUMMARY

Embodiments of the present disclosure provide systems and methods for observing a sample in a multi-beam apparatus. In one aspect of the present disclosure, a multi-beam apparatus may comprise an array of deflectors configured to steer individual beamlets of multiple beamlets, each deflector of the array of deflectors having a corresponding driver configured to receive a signal for steering a corresponding individual beamlet. The apparatus may further include a controller having circuitry to acquire profile data of a sample and to control each deflector by providing the signal to the corresponding driver based on the acquired profile data, and a steering circuitry comprising the corresponding driver configured to generate a driving signal, a corresponding compensator configured to receive the driving signal and a set of driving signals from other adjacent drivers associated with adjacent deflectors and to generate a compensation signal to compensate a corresponding deflector based on the driving signal and the set of driving signals. The profile data may include a region of interest of the sample. The region of interest may be identified based on a previous coarse scan of the sample or on an analysis of layout data of the sample.

In some embodiments, the steering circuitry may further comprise a corresponding amplifier for each deflector of the deflector array, wherein the corresponding amplifier may be configured to amplify the compensation signal to be provided to the corresponding deflector. The controller may be configured to identify the region of interest from the profile data and to control the steering of at least one individual beamlet of the multiple beamlets to inspect the region of interest independent from the other beamlets of the multiple beamlets.

In another aspect of the present disclosure, a method for observing a sample in a multi-beam apparatus is disclosed. The method may include steering, using an array of deflectors, individual beamlets of multiple beamlets, each deflector of the array of deflectors having a corresponding driver configured to receive a signal for steering a corresponding individual beamlet, and acquiring, using a controller having circuitry, profile data of the sample and controlling each deflector by providing the signal to the corresponding driver based on the acquired profile data.

The method may include a steering circuitry for each deflector of the deflector array configured to generate a driving signal using a corresponding driver, receive the driving signal and a set of driving signals from other adjacent drivers associated with adjacent deflectors using a corresponding compensator, and generate, using the corresponding compensator, a compensation signal to compensate a corresponding deflector based on the driving signal and the set of driving signals.

In some embodiments, the method may further comprise amplifying, using a corresponding amplifier for each deflector of the deflector array, the compensation signal to be provided to the corresponding deflector. The controller may be configured to identify the region of interest from the profile data and to control the steering of at least one individual beamlet of the multiple beamlets to inspect the region of interest independent from the other beamlets of the multiple beamlets.

In yet another aspect, the present disclosure is directed to a non-transitory computer readable medium storing a set of instructions that is executable by one or more processors of a multi-beam apparatus to cause the multi-beam apparatus to perform a method to observe a sample. The method may include steering, using an array of deflectors, individual beamlets of multiple beamlets, each deflector of the array of deflectors having a corresponding driver configured to receive a signal for steering a corresponding individual beamlet, and acquiring, using a controller having circuitry, profile data of the sample and controlling each deflector by providing the signal to the corresponding driver based on the acquired profile data. The method may further include causing a steering circuitry to perform generating a driving signal, receiving the driving signal and a set of driving signals from other adjacent drivers associated with adjacent deflectors, and generating a compensation signal to compensate a corresponding deflector based on the driving signal and the set of driving signals.

Additional objects and advantages of the disclosed embodiments will be set forth in part in the following description, and in part will be apparent from the description, or may be learned by practice of the embodiments. Objects and advantages of the disclosed embodiments may be realized and attained by the elements and combinations set forth in the disclosure. However, exemplary embodiments of the present disclosure are not necessarily required to achieve such exemplary objects and advantages, and some embodiments may not achieve any of the stated objects and advantages.

It is to be understood that both the foregoing general description and the following detailed description are exemplary and explanatory only and are not restrictive of the disclosed embodiments, as claimed.

BRIEF DESCRIPTION OF THE DRAWINGS

The above and other aspects of the present disclosure will become more apparent from the description of exemplary embodiments, taken in conjunction with the accompanying drawings in which.

DETAILED DESCRIPTION OF THE DRAWINGS

Figure 1:
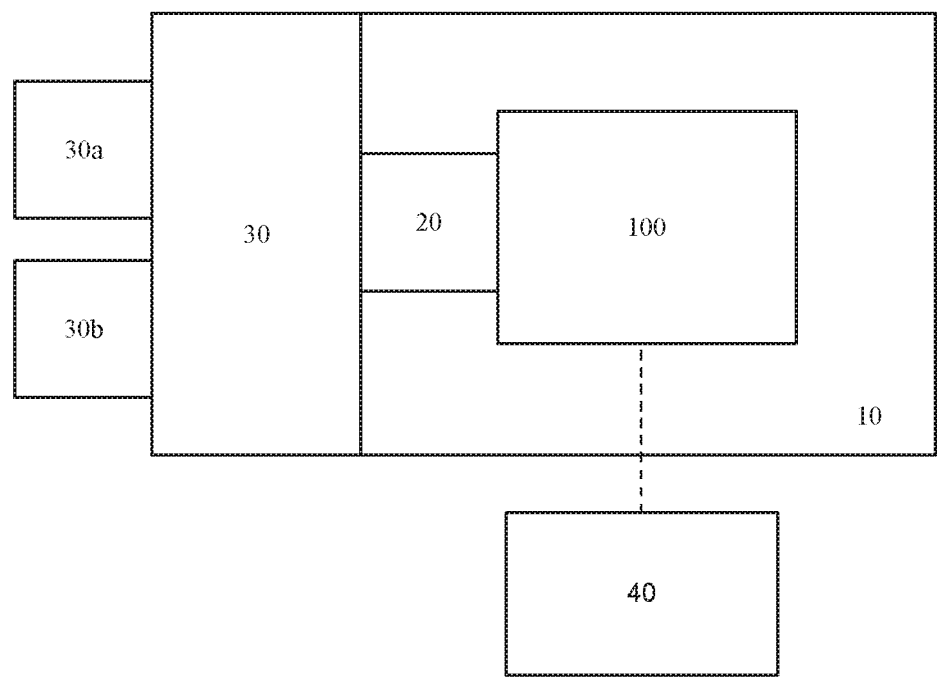
FIG. 1 is a schematic diagram illustrating an exemplary electron beam inspection (EBI) system, consistent with embodiments of the present disclosure.

Reference will now be made in detail to exemplary embodiments, examples of which are illustrated in the drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to subject matter that may be recited in the appended claims. For example, although some embodiments are described in the context of systems utilizing electron beams, the disclosure is not so limited. Other types of charged particle beams may be similarly applied, such as in optical imaging, photo detection, x-ray detection, ion detection, etc.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which may be the size of a thumbnail) may include over 2 billion transistors, the size of each transistor being less than 1/1000th of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

As the geometries shrink and the IC chip industry migrates to three-dimensional (3D) architectures (such as, NAND gates, Fin field-effect transistors (FinFETs), and advanced dynamic random-access memory (DRAM)), finding defects is becoming more challenging and expensive at each lower node. While high process yield is desirable in an IC chip manufacturing facility, it is also essential to maintain a high wafer throughput, defined as the number of wafers processed per hour. High process yields, and high wafer throughput can be impacted by the presence of defects, especially when operator intervention is involved. Thus, detection and identification of micro and nano-sized defects by inspection tools (such as, a SEM) may be essential for maintaining high yields, high throughput, and low cost.

Semiconductor chips are fabricated in an extremely clean and controlled environment that has a very low level of pollutants such as dust, airborne particles, aerosol particles, and chemical vapors. More specifically, a semiconductor cleanroom is required to have a controlled level of contamination that is specified by the number of particles per cubic foot at a specified particle size. A typical chip manufacturing cleanroom contains 1-10 particles per cubic foot of air, each particle being less than 5 urn in diameter. For comparison, the ambient air outside in a typical city environment contains approximately 1.25 billion particles per cubic foot, each particle having an average size of ~200 urn in diameter. A speck of dust as small as 1 um, on a wafer in process may span across thousands of transistors located on the chip, which could potentially render the entire chip useless. In some cases, a speck of dust on a reticle or a photomask that is used to create repeating patterns on the wafer may cause recurring physical or electrical defects. For example, one or more metal wires connecting transistors in a single chip may overlap or may be undesirably connected through the dust particle, causing a short in the circuit throughout the entire chip. Identifying and characterizing each defect or defect type while maintaining high throughput may improve process yield and product reliability.

It is increasingly important to ensure the ability to detect defects with high accuracy and high resolution while maintaining high throughput (defined as the number of wafer processes per hour, for example). High process yields and high wafer throughput may be impacted by the presence of defects, especially when operator intervention is involved. Thus, detection and identification of micro and nano-sized defects by inspection tools (such as a SEM) is important for maintaining high yields and low cost.

In some inspection tools, a sample may be inspected by scanning a beam of high energy electrons over the sample surface. The beam may be focused into a probe spot on the sample surface. Due to interactions at the sample surface, secondary electrons may be generated from the sample that are then detected by a detector.

To increase throughput, some inspection tools may use multiple beams for forming multiple probe spots on the sample surface simultaneously. As one example, an inspection tool may generate a primary beam that is split into multiple beams (e.g., "beamlets") that may then each be scanned over the sample surface.

Figure 3:
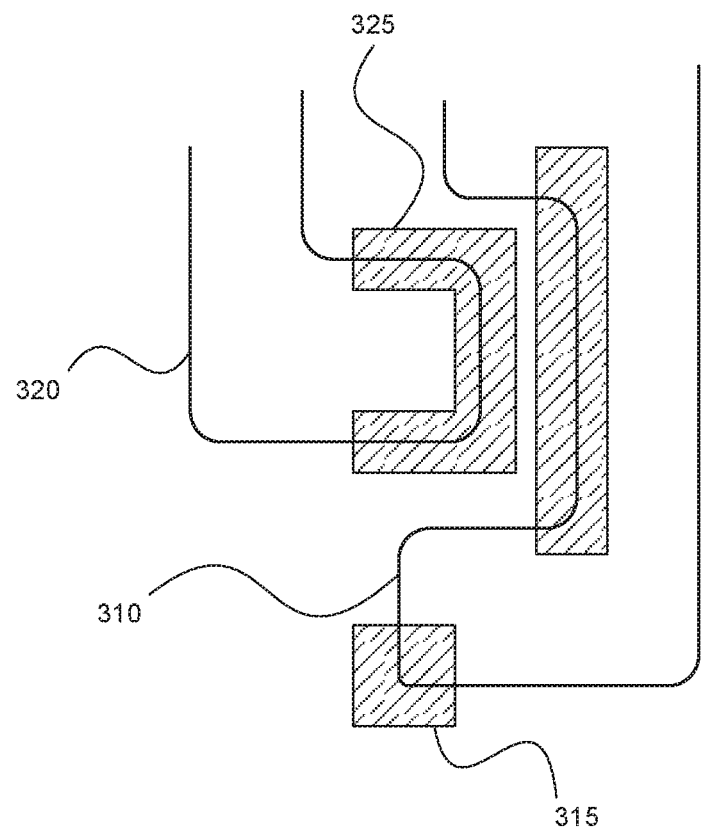
FIG. 3 is a representation of an exemplary regions of interest on a wafer, consistent with embodiments of the present disclosure.

As a charged-particle beam or a beamlet is scanned over the surface of a sample, detection signals may be generated when the beam encounters features, such as the edges of microstructures on the surface, or the surface of the sample itself. However, not all of the wafer may contain patterns and features of critical dimensions or critical tolerances. For example, the area between the edges of a metal wire may merely consist of bulk material, and scanning such regions may not yield useful data for defect analysis or troubleshooting a process issue. In the context of this disclosure, these regions may be defined as "regions of non-interest" or "regions of non-relevance". On the other hand, some areas on the wafer may include "regions of interest," or "regions of relevance," defined herein as regions on the wafer that may contain critical process and product related information, such as edges of metal wires, conduction channel of a transistor, etc. FIG. 3 (described later) shows features 310 and 320, such as pattern edges, that may be of interest, while other portions of the sample area may not be of interest.

In a wafer manufacturing facility, such as a wafer FAB, the throughput may be increased by using a multiple charged-particle beams in an inspection apparatus, such as a multi-beam SEM. Although, each of the multiple beams may be deflected to produce multiple probe spots on the wafer, they can only do so collectively, in unison. In other words, each beamlet may move in the same direction as the rest of the beamlets. This collective movement of all the beamlets in one direction renders the scanning inefficient because the beamlets scan the regions of interest and regions of non-interest without differentiating between the two. Furthermore, there may be redundancies where the beamlets scan over the same areas of bulk material where no features are present. Some aspects of the present disclosure propose individual steering of each of the beamlets to preferentially scan regions of interest, thereby increasing the overall throughput and efficiency. Individual beam steering may include deflecting each of the beamlets in the beam independent of the other beamlets such that each beamlet is directed to scan only the regions of interest. For example, if the beam comprises 4 beamlets, each of the beamlet may be deflected individually such that only the edges of a rectangular metal pad are scanned, without collecting scan information from the area of the pad bound by the four edges.

In a conventional multi-beam SEM, the multiple beamlets form a grid, with each of the beamlets being a uniform spacing away from its immediately neighboring beamlets as the beamlets impact a sample. In such a configuration, while some of the beamlets may probe regions of interest, the other beamlets may probe regions of non-interest or non-relevance as well, resulting in an inefficient scan. Some of the disclosed embodiments in this disclosure are directed to diverting the path of one or more individual beamlets of a grid such that they are steered to probe regions of interest on the sample, forming a grid of beamlets where the spacing between each of the beamlets varies as each beamlet is independently steered to a region of interest. The regions of interest on the sample may be pre-determined based on prior knowledge including, but not limited to, layout data, reference scans, previous scans of the sample, etc. The individual steering of one or more beamlets of a grid of beamlets may allow for improved efficiency in beam usage.

In some embodiments of the present disclosure, individual beamlets may be steered toward interesting features on a sample, such as pattern edges. Beamlets may be preferentially directed to features that produce more useful data. In some embodiments, a beamlet steering deflector may be provided that may divert the trajectory of beamlets passing through it. A beamlet steering deflector may be provided as a component in an optical system of a charged-particle beam apparatus. The beamlet steering deflector may be arranged in such a manner that it may generate only a small electric field to cause a change in the trajectory of the electrons forming the beamlet to direct it to desired features.

The beamlet steering deflector may be operated by applying a voltage to an electrode, and may generate an electric field. Excitation of the beamlet steering deflector may be set to be small enough that it does not affect neighboring beams. Furthermore, the beamlet steering deflector may be configured so that the change in trajectory of the beam has been compensated based on neighboring beams or beamlets. For example, when multiple beamlets are used in a multi-beam apparatus, the separation distance between adjacent beamlets may be relatively small. Because beams may be affected by the Coulomb effect, it may be desirable to compensate beamlets to take into consideration the surrounding beams. A beamlet steering deflector may be configured to make only minute changes to the trajectory of a beamlet so that it may be directed toward particular features while avoiding adverse impacts on other beams of the system.

Reference is now made to FIG. 1, which illustrates an exemplary electron beam inspection (EBI) system 1, consistent with embodiments of the present disclosure. EBI system 1 may be used for imaging. As shown in FIG. 1, EBI system 1 includes a main chamber 10, a load/lock chamber 20, an electron beam tool 100, an equipment front end module (EFEM) 30, and a controller 40. Electron beam tool 100 is located within main chamber 10. EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples may be collectively referred to as "wafers" herein).

One or more robotic arms (not shown) in EFEM 30 may transport the wafers to load/lock chamber 20. Load/lock chamber 20 is connected to a load/lock vacuum pump system (not shown) which removes gas molecules in load/lock chamber 20 to reach a first pressure below the atmospheric pressure. After reaching the first pressure, one or more robotic arms (not shown) may transport the wafer from load/lock chamber 20 to main chamber 10. Main chamber 10 is connected to a main chamber vacuum pump system (not shown) which removes gas molecules in main chamber 10 to reach a second pressure below the first pressure. After reaching the second pressure, the wafer is subject to inspection by electron beam tool 100. Electron beam tool 100 may be a single-beam system or a multi-beam system. Controller 40 may be electronically connected to electron beam tool 100, and may be electronically connected to other components as well. Controller 40 may be a computer configured to execute various controls of EBI system 1. The controller may be outside of the structure of EBI system 1 as shown in FIG. 1 that includes main chamber 10, load/lock chamber 20, and EFEM 30, or may be incorporated and form part of the structure.

Figure 2A:
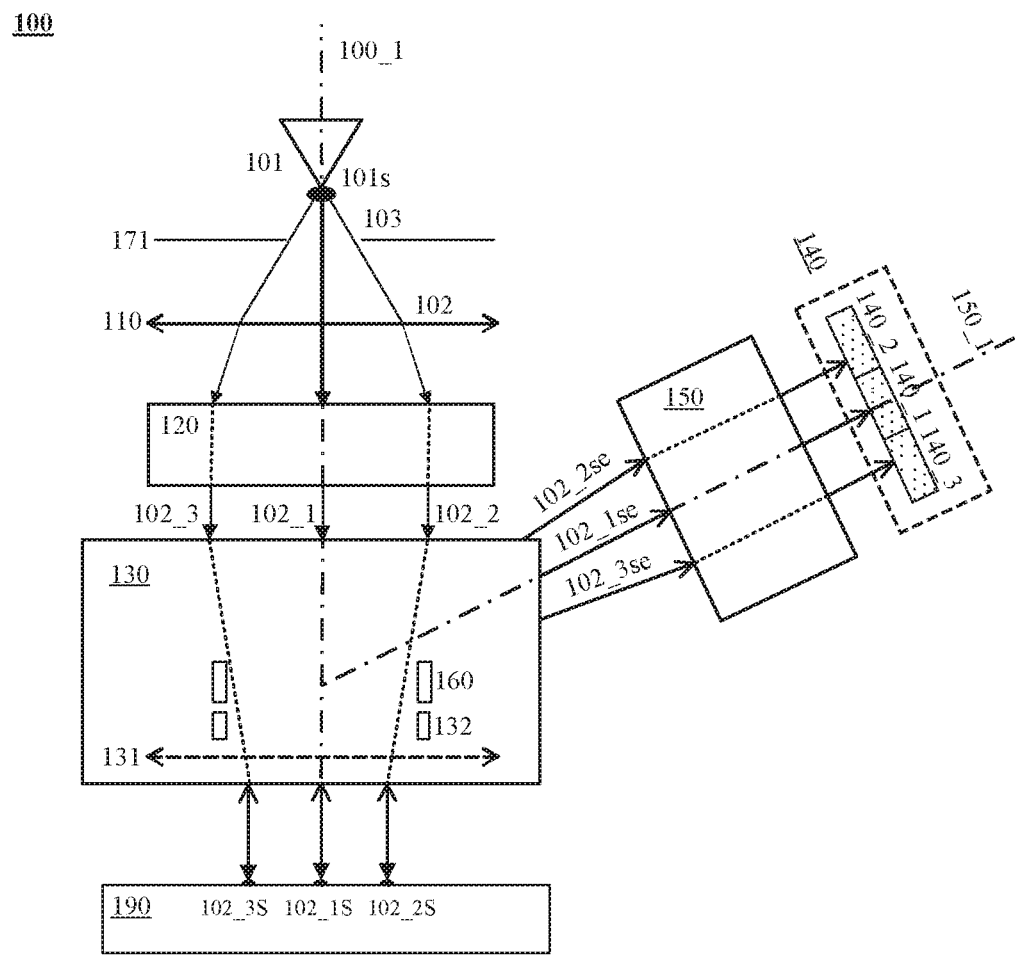
FIG. 2A is a schematic diagram illustrating an exemplary electron beam tool, consistent with embodiments of the present disclosure that may be a part of the exemplary electron beam inspection system of FIG. 1.

FIG. 2A illustrates a multi-beam inspection tool as an example of a charged particle beam apparatus that may form a part of EBI system 1 of FIG. 1. In some embodiments, EBI system 1 may comprise a multi-beam inspection tool that uses multiple primary electron beamlets to simultaneously scan multiple locations on a sample.

As shown in FIG. 2A, electron beam tool 100 (also referred to herein as apparatus 100) may comprise an electron source 101, a gun aperture 171, a condenser lens 110, a primary electron beam 102 emitted from electron source 101, a source conversion unit 120, a plurality of beamlets 102_1, 102_2, and 102_3 of primary electron beam 120, a primary projection optical system 130, a wafer stage (not shown in FIG. 2A), multiple secondary electron beams 102_1se, 102_2se, and 102_3se, a secondary optical system 150, and an electron detection device 140. A controller, image processing system, and the like may be coupled to electron detection device 140. Primary projection optical system 130 may comprise a beam separator 160, deflection scanning unit 132, and objective lens 131. Electron detection device 140 may comprise detection sub-regions 140_1, 140_2, and 140_3.

Electron source 101, gun aperture 171, condenser lens 110, source conversion unit 120, beam separator 160, deflection scanning unit 132, and objective lens 131 may be aligned with a primary optical axis 100_1 of apparatus 100. Secondary optical system 150 and electron detection device 140 may be aligned with a secondary optical axis 150_1 of apparatus 100.

Electron source 101 may comprise a cathode, an extractor or an anode, wherein primary electrons can be emitted from the cathode and extracted or accelerated to form a primary electron beam 102 with a crossover (virtual or real) 101s. Primary electron beam 102 can be visualized as being emitted from crossover 101s. Gun aperture 171 may block off peripheral electrons of primary electron beam 102 to reduce size of probe spots 102_1S, 102_2S, and 102_3S.

Source conversion unit 120 may comprise an array of image-forming elements (not shown in FIG. 2A) and an array of beam-limit apertures (not shown in FIG. 2A). An example of source conversion unit 120 may be found in U.S. Pat. No. 9,691,586; U.S. Publication No. 2017/0025243; and International Application No. PCT/EP2017/084429, all of which are incorporated by reference in their entireties. The array of image-forming elements may comprise an array of micro-deflectors or micro-lenses. The array of image-forming elements may form a plurality of parallel images (virtual or real) of crossover 101s with a plurality of beamlets 102_1, 102_2, and 102_3 of primary electron beam 102. The array of beam-limit apertures may limit the plurality of beamlets 102_1, 102_2, and 102_3.

Condenser lens 110 may focus primary electron beam 102. The electric currents of beamlets 102_1, 102_2, and 102_3 downstream of source conversion unit 120 may be varied by adjusting the focusing power of condenser lens 110 or by changing the radial sizes of the corresponding beam-limit apertures within the array of beam-limit apertures. Condenser lens 110 may be a moveable condenser lens that may be configured so that the position of its first principle plane is movable. The movable condenser lens may be configured to be magnetic, which may result in off-axis beamlets 102_2 and 102_3 landing on the beamlet-limit apertures with rotation angles. The rotation angles change with the focusing power and the position of the first principal plane of the movable condenser lens. In some embodiments, the moveable condenser lens may be a moveable anti-rotation condenser lens, which involves an anti-rotation lens with a movable first principal plane. Movable condenser lens is further described in U.S. Publication No. 2017/0025241, which is incorporated by reference in its entirety.

Objective lens 131 may focus beamlets 102_1, 102_2, and 102_3 onto a wafer 190 for inspection and may form a plurality of probe spots 102_1S, 102_2S, and 102_3S on the surface of wafer 190.

Beam separator 160 may be a beam separator of Wien filter type generating an electrostatic dipole field and a magnetic dipole field. In some embodiments, if they are applied, the force exerted by electrostatic dipole field on an electron of beamlets 102_1, 102_2, and 102_3 may be equal in magnitude and opposite in direction to the force exerted on the electron by magnetic dipole field. Beamlets 102_1, 102_2, and 102_3 can therefore pass straight through beam separator 160 with zero deflection angle. However, the total dispersion of beamlets 102_1, 102_2, and 102_3 generated by beam separator 160 may also be non-zero. Beam separator 160 may separate secondary electron beams 102_1se, 102_2se, and 102_3se from beamlets 102_1, 102_2, and 102_3 and direct secondary electron beams 102_1se, 102_2se, and 102_3se towards secondary optical system 150.

Deflection scanning unit 132 may deflect beamlets 102_1, 102_2, and 102_3 to scan probe spots 102_1S, 102_2S, and 102_3S over a surface area of wafer 190. In response to incidence of beamlets 102_1, 102_2, and 102_3 at probe spots 102_1S, 102_2S, and 102_3S, secondary electron beams 102_1se, 102_2se, and 102_3se may be emitted from wafer 190. Secondary electron beams 102_1se, 102_2se, and 102_3se may comprise electrons with a distribution of energies including secondary electrons and backscattered electrons. Secondary optical system 150 may focus secondary electron beams 102_1se, 102_2se, and 102_3se onto detection sub-regions 140_1, 140_2, and 140_3 of electron detection device 140. Detection sub-regions 140_1, 140_2, and 140_3 may be configured to detect corresponding secondary electron beams 102_1*se*, 102_2*se*, and 102_3*se* and generate corresponding signals used to reconstruct an image of surface area of wafer 230.

Although FIG. 2A shows an example of electron beam tool 100 as a multi-beam inspection tool that uses a plurality of beamlets, embodiments of the present disclosure are not so limited. For example, electron beam tool 100 may also be a single-beam inspection tool that uses only one primary electron beam to scan one location on a wafer at a time.

In some embodiments, a beam steering deflector may be provided after a beam conditioning section of a charged particle beam apparatus. For example, source conversion unit 120, discussed above with respect to FIG. 2A, may condition beams travelling therethrough in various ways. Beams may be shaped, trimmed, focused, and the like. Optical elements may be provided to accomplish such functions. For example, a beam trimming aperture may limit currents of beamlets. In some embodiments, a beamlet steering deflector may be provided downstream of a beam trimming aperture and may be used to steer beamlets toward predetermined areas on a sample surface.

In some embodiments, a beam conditioning section may further comprise image-forming elements, aberration compensators, and other elements. A beamlet steering deflector may be provided downstream of such elements.

Figure 2B:
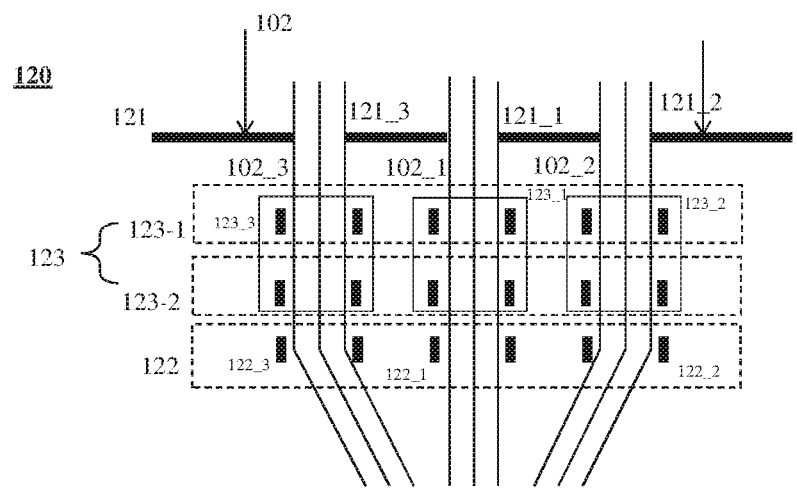
FIG. 2B is a schematic diagram illustrating a portion of an exemplary source conversion unit in a multi-beam inspection system with multiple aberration-compensator layers and an image-forming element layer, consistent with embodiments of the present disclosure.

Reference is now made to FIG. 2B, which illustrates a portion of an exemplary source conversion unit 120 in a multi-beam inspection system, consistent with embodiments of the present disclosure. As shown in FIG. 2B, source conversion unit 120 includes a beamlet-limit aperture array 121, an image-forming element array 122, and an aberration compensator array 123. Aberration compensator array 123 may be provided in layers 123-1 and 123-2. Moreover, while FIG. 2B shows each of these arrays handling a 1×3 array of beamlets, it is appreciated that such arrays may handle any number of arrays of beamlets.

Beamlet-limit aperture array 121 includes three beam-limit apertures 121_1, 121_2, and 121_3. A collimated primary electron beam 102 is incident onto beamlet-limit aperture array 121 and divided into three beamlets 102_1, 102_2, and 102_3 via corresponding beam-limit apertures 121_1, 121_2, and 121_3. The pitches of beam-limit apertures 121_1, 121_2, and 121_3 may be set to make equal pitches of probe spots on the sample surface.

Image-forming element array 122 includes three image-forming micro-deflectors 122_1, 122_2, and 122_3. Image-forming micro-deflectors 122_1-122_3 may respectively deflect beamlets 102_1, 102_2, and 102_3 to form three images of the electron source that generates primary electron beam 102. For example, reference is now made to FIG. 2C, which is a schematic diagram illustrating a configuration of electrodes of an exemplary micro-deflector 122_3, consistent with embodiments of the present disclosure. In particular, when a zero voltage is applied to one pair of opposite poles, and two voltages of the same absolute value but opposite directions are applied to the other pair of opposite poles, the multi-pole structure is configured to function as a micro-deflector. For example, in FIG. 2C, when e2 and e4 are grounded (voltage set to 0), e1 is set to V2, and e3 is set to −V2, the multi-pole structure functions as a micro-deflector. When operating as a micro-deflector, as V2 increases, the angle of deflection of the beamlet increases as well.

In some embodiments, a beamlet steering deflector may be provided downstream from components of a source conversion unit, for example those discussed above. In some embodiments, a beam steering deflector may include structures similar to the multipole structure 122_3.

Reference is now made to FIG. 3, which shows a representation of a sample surface to be inspected by a charged-particle beam tool such as electron beam tool 100, consistent with embodiments of the present disclosure. A sample may include various structures, such as line traces 310 and 320. The bulk of material of line traces 310 and 320 may be unremarkable, but important information may be derived from structure edges 315 and 325. For example, information on pattern pitch, line width, and separation distance may be derived from analyzing structure edges and may be indicative of certain types of defects, such as disconnects, thinning defects, and the like.

In some embodiments, the locations of structure edges 315 and 325 on the wafer in terms of x-y coordinates may be stored in a database accessible to a user or a controller (e.g., controller 40 of FIG. 1) analyzing the sample. The user may build a repository or a database of "regions of interest" to be inspected before, after or during a process. For example, the regions of interest may include features with critical dimensions and tolerances, edges of metal interconnects, edges of mesa pads, defect-prone areas such as, for example, edges of a wafer. In some embodiments, process qualification checks may be based on analysis of regions of interest. Such pre-defined regions of interest of a wafer for inspection may improve throughput and wafer scanning efficiency.

Figure 4:
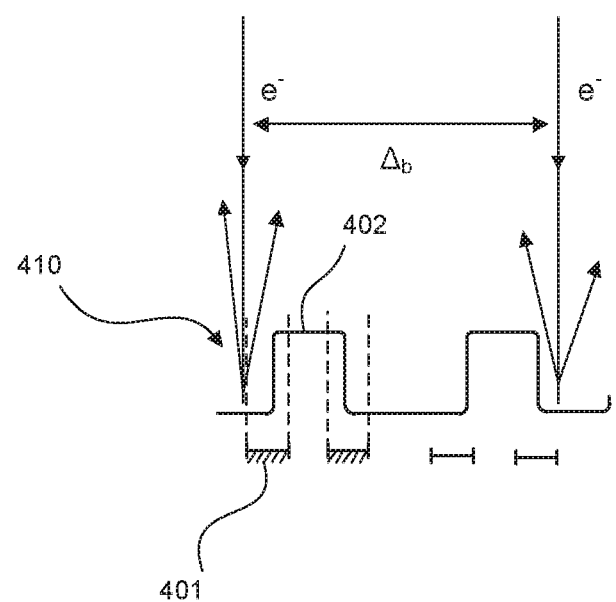
FIG. 4 is a view of a portion of FIG. 3 showing secondary electrons being projected toward a detector from regions of interest of the wafer, consistent with embodiments of the present disclosure.

FIG. 4 shows a cross-sectional view of a pattern on a sample surface. The pattern may include a plurality of structures 410, such as line traces on a wafer. Structures 410 may have a uniform pitch across the sample or may be patterned in a pre-defined layout based on the application. As illustrated, charged-particle beamlets comprising charged-particles such as electrons, may be directed to probe the regions of interest of structure 410. FIG. 4 illustrates a plurality of secondary electrons generated from the probe spots on structure 410 of the sample, and directed towards a detector. In a multi-beam apparatus, multiple electron beamlets (e.g., beamlets 102_1, 102_2, and 102_3 of FIG. 2) may be projected onto the sample surface. The pitch between adjacent beamlets may be distance Δb.

In inspecting a sample, the most relevant areas to be scanned may be the edges of structures 410 formed on the wafer surface. For example, edge portions 401 may be important areas to scan. Electrons interacting with the sample surface may produce the most meaningful data when scanning over edge portions 401. In some applications, the feature-less surfaces 402, between edge portions 401 may be of less importance for the type of inspection typically being carried out. Therefore, a significant portion of the time spent scanning beams across the surface of a wafer may be used inefficiently when scanning feature-less surfaces 402.

In conventional multi-beam systems, multiple electron beamlets may follow the same scan pattern. Therefore, it may not be possible to skip irrelevant portions or regions of non-interest on a sample surface. Because each of the beamlets move collectively in a pre-defined direction and pattern, a typical SEM scan of a multi-beam apparatus may include images comprising information related with edge portions 401 and feature-less surfaces 402. This may lead to inefficient beam current usage and resources, thus adversely affecting the overall throughput.

In some of the disclosed embodiments, individual beamlet steering may be used to steer individual beamlets preferentially toward features that are of relevance and interest. For example, individual beamlets of a multi-beam apparatus may be individually deflected or steered as the beamlets scan over a sample surface.

Figure 5:
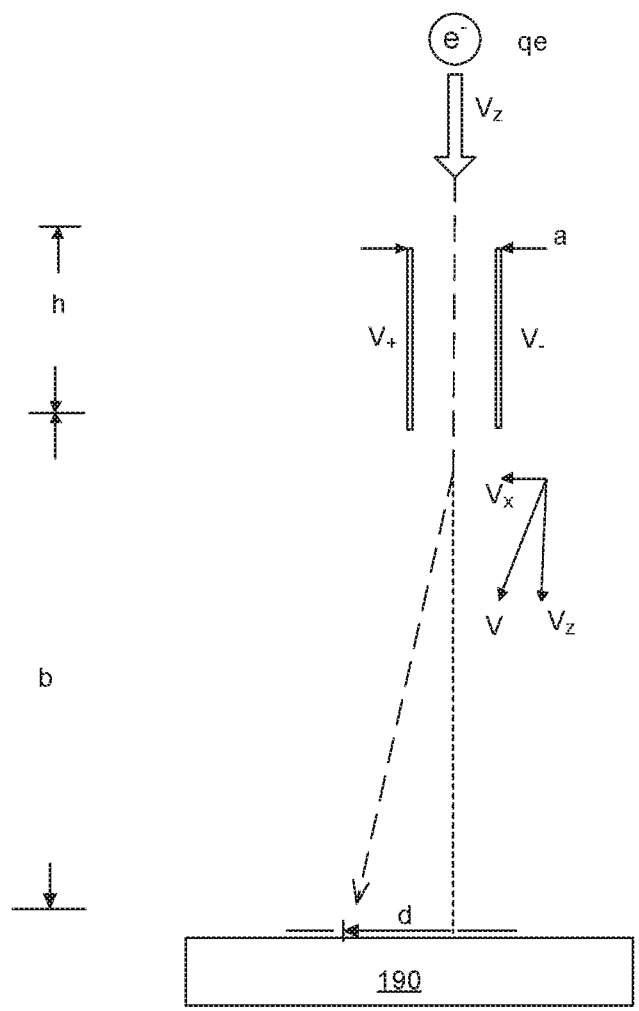
FIG. 5 illustrates an example of deflection of an electron landing on the region of interest on the wafer, consistent with embodiments of the present disclosure.

Reference is now made to FIG. 5, which shows a representation of a beamlet being deflected by a beamlet steering deflector, consistent with embodiments of the present disclosure. A beamlet steering deflector may be configured to deflect a beamlet by a predetermined deflection distance d. The amount of deflection to be induced by a beamlet steering deflector may be set to be less than distance ib. Therefore, a very small electric field may suffice to induce beamlet steering deflection on individual beamlets by deflection distance d. The amount of deflection may be calculated and determined based on various criteria.

The electric field E across a pair of electrodes separated by a distance a, may be defined by the equation:

$$E = \frac{\Delta V}{a} = \frac{V_+ - V_-}{a} \quad \text{(Equation 1)}$$

where $V_+$ is the positive potential applied to an electrode, $V_-$ is the negative potential applied to another electrode, and a is the distance separating the two electrodes.

It is to be appreciated that actual force on an electron with a charge q is expressed by equation:

$$F = qe \cdot E \quad \text{(Equation 2)}$$

where F represents the actual force on an electron under an electric field E.

The vertical component of the velocity of the electron traveling in a deflected direction V as illustrated in FIG. 5, may be expressed by equation 3:

$$V_z = \frac{1}{2}\frac{F}{m_e}t^2 \quad \text{(Equation 3)}$$

where t denotes the time required to travel vertical distance h, the height of the electrodes.

The deflection distance may be calculated based on the equations listed above (Equations 1-3).

$$d = b\frac{V_x}{V_z} = \frac{b}{z}\frac{F}{V_z m_e}t^2 \quad \text{(Equation 4)}$$

$$= \frac{b}{z}\frac{qe(V_+ - V_-)}{V_z m_e a}\frac{h^2}{V_z^2} \quad \text{(Equation 5)}$$

$$= \frac{bqe(V_+ - V_-)h^2}{V_z^3 m_e a} \quad \text{(Equation 6)}$$

where b is the vertical distance along the optical axis of the primary electron beamlet from the electrode to sample, and $m_e$ is the mass of the electron.

Figure 6A:
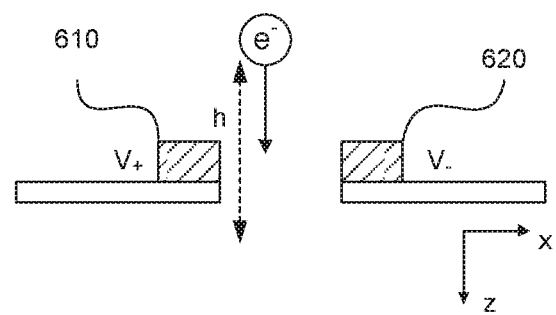
FIGS. 6A and 6B illustrate exemplary arrangements of a beamlet steering deflector, consistent with embodiments of the present disclosure.
Figure 6B:
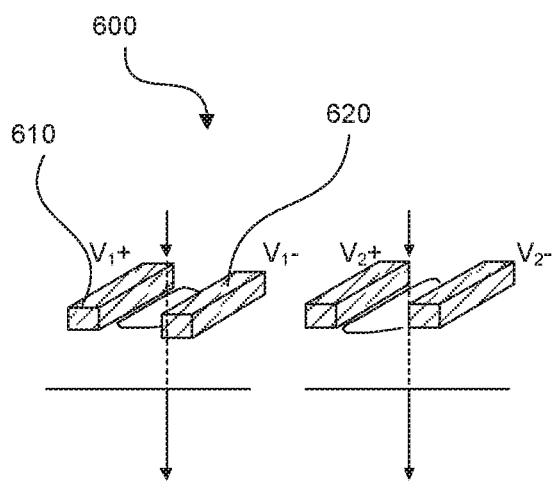

Reference is now made to FIGS. 6A and 6B, which illustrate exemplary structures of a beamlet steering deflector 600, consistent with embodiments of the present disclosure. Beamlet steering deflector 600 may comprise an array of deflectors configured to steer individual beamlets. In some embodiments, beamlet steering deflector 600 may be part of an array of deflectors having a multi-pole structure (e.g., such as the multi-pole structure of FIG. 2C).

As illustrated in FIGS. 6A and 6B, each deflector of beamlet steering deflector 600 may comprise a pair of electrodes, 610 and 620, equal in magnitude but having opposite polarity. For example, electrode 610 may be positively biased at V+x volts, then electrode 620 may be negatively biased at V-x volts. As seen in FIGS. 6A and 6B, electrodes 610 and 620 of beamlet steering deflector 600 may be disposed on a micro-electromechanical systems (MEMS) aperture. For example, the MEMS aperture may be apertures of a current limiting aperture array. The current limiting aperture array may comprise a structure having multiple apertures or holes arranged in an array configured to adjust the individual beamlet current by blocking some off-axis electrons. The current limiting aperture array may be a part of or positioned within the MEMS optics including micro-lens arrays.

In some embodiments, current limiting aperture array may be disposed upstream from the array of deflectors. In other words, beamlet steering deflector 600 may be positioned below the current limiting aperture array. Such a configuration may allow focused individual beamlets, generated by the current limiting aperture array, to be deflected or steered by beamlet steering deflector 600 before forming a probing spot on the sample. Electrodes 610 and 620 may have a rectangular cross-section as shown in FIG. 6B. Other cross-sections such as, but not limited to circular, or elliptical, or the like may be used as well.

Figure 2C:
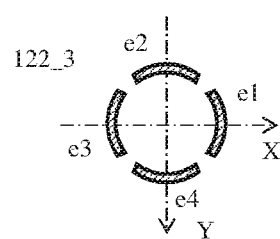
FIG. 2C is a schematic diagram illustrating a configuration of exemplary electrode and pole-piece elements, consistent with embodiments of the present disclosure.

In some embodiments, beamlet steering deflector 600 may comprise an array of multi-pole structures. The multi-pole structures may have a dipole configuration (2 electrodes as shown in FIG. 6B), or a quadrupole configuration (4 electrodes as shown in FIG. 2C), or an octupole configuration (8 electrodes) etc. It is appreciated that a deflector with 12 or more electrodes configuration may also be used.

A multi-pole structure includes two or more segmented electrodes. The multi-pole structure may have a central axis and one or more symmetry planes bisecting a pair of opposite segmented electrodes. An orientation direction of a multi-pole structure is a direction of one of the symmetry planes and is perpendicular to the central axis. A radial shift direction of a multi-pole structure is a direction from optical axis to the central axis. A dipole structure may only generate a dipole field in its orientation direction, therefore, if a dipole structure is used as a deflector or a micro-deflector, the dipole structure may be positioned in a way that the orientation direction matches the deflection direction of a corresponding beamlet. If a quadrupole structure or an octupole structure is used as a micro-deflector, such limitation does not present because a quadrupole structure or an octupole structure may generate a dipole field in any direction perpendicular to its central axis by controlling voltages applied to each electrode.

For example, if the multi-pole structure has four segmented electrodes (i.e., a quadrupole structure) and two voltages having the same absolute value and opposite polarities are applied to one pair of opposite electrodes, while a zero voltage is applied to one pair of opposite poles, the multi-pole structure is configured to function as a micro-deflector. For example, in FIG. 2C, when V1 is applied to e2, −V1 is applied to e4, 0 V is applied to e1 and e3, the multi-pole structure functions as a micro-deflector. The dipole field can be changed in value and direction by varying V1 and V2.

Figure 7:
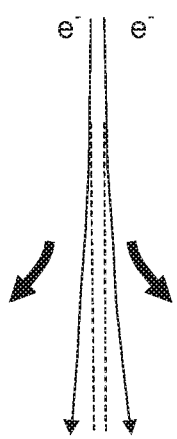
FIG. 7 is a representation of exemplary deflection of an electron that may travel in a beam column, consistent with embodiments of the present disclosure.

In some embodiments, the distance between neighboring beamlets may be small enough based on the position of the structures on the wafer being inspected, such that the neighboring beamlets may interact with each other. In such cases, the spatial and lateral resolution of the apparatus may be impacted because of the coulomb interaction effect. The proximity of neighboring beamlets may cause the beamlets to divert from their intended and desired path, as illustrated in FIG. 7.

Figure 8:
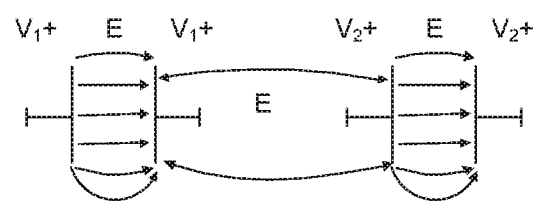
FIG. 8 is a schematic representation of cross-talks of electric field between adjacent electrodes, consistent with embodiments of the present disclosure.

Reference is now made to FIG. 8, which illustrates a schematic representation of cross-talks of electric field between adjacent electrodes, consistent with embodiments of the present disclosure. It is appreciated that the electric field across a pair of electrodes of a deflector may influence the electric field across the pair of electrodes of the neighboring deflector, based on the voltages applied on each of the electrodes and the distance between the two deflectors. In some embodiments (as further described below), the electric field applied to the deflectors may be compensated to account for the cross-talk. The electric field applied to the deflectors may be compensated in a feed-back or a feed-forward compensation mechanism.

Figure 9:
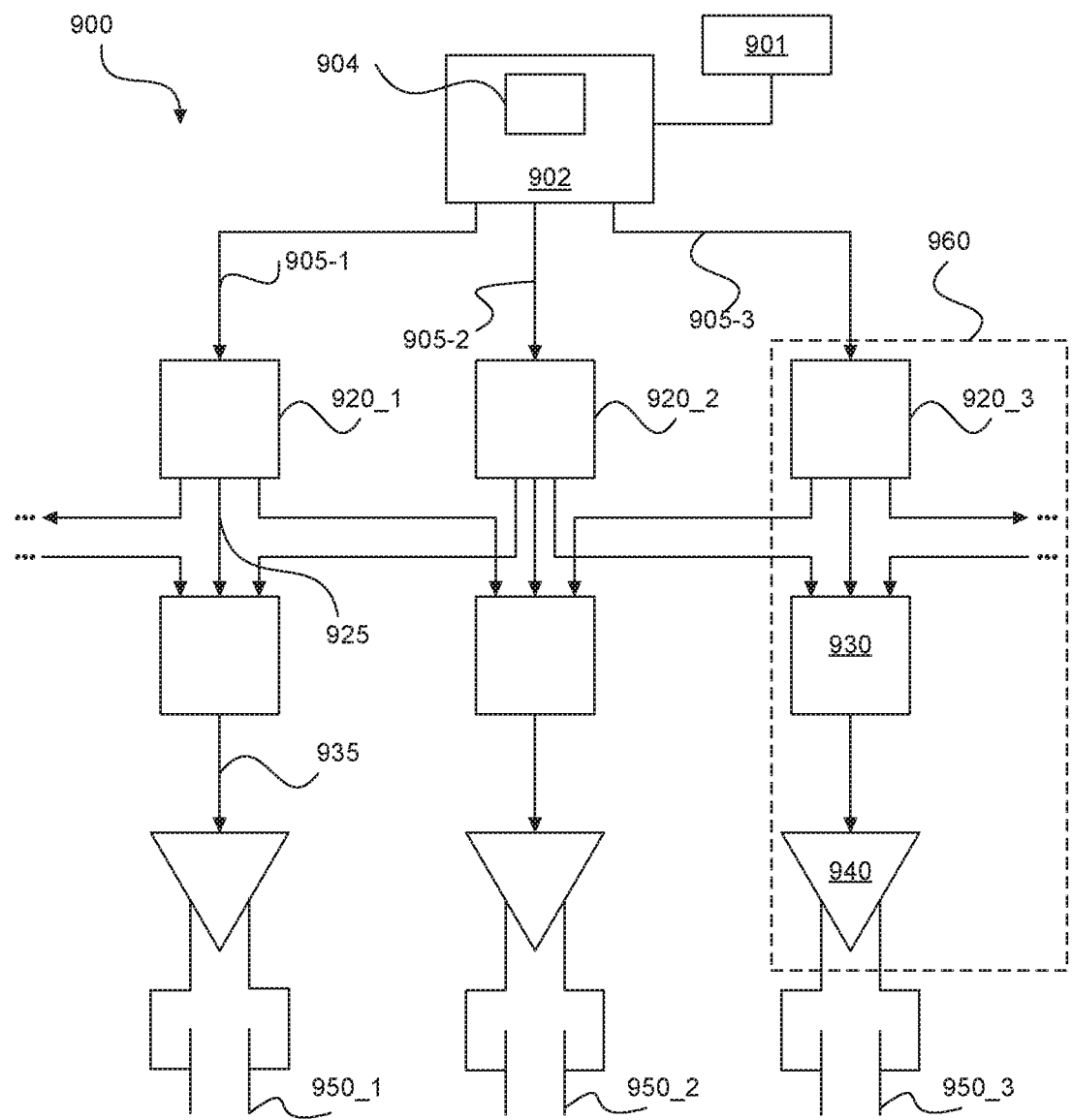
FIG. 9 illustrates exemplary steering architecture, consistent with embodiments of the present disclosure.

Reference is now made to FIG. 9, which illustrates an exemplary steering architecture 900, consistent with embodiments of the present disclosure. Steering architecture 900 may comprise a database 901 configured to store profile data, a controller 902 comprising a micro-processor 904, and steering circuitry 960 for each beamlet steering deflector 950. Steering circuitry 960 may include a driver 920_3, a compensator 930, and amplifier 940.

In some embodiments, database 901 may be configured to store profile data of the sample (e.g., wafer 190). Profile data may comprise information related with including, but not limited to, the layout, pitch, dimensions, positioning coordinates, shape, regions of interest, structure density, etc. The region of interest may be identified in various ways, such as based on a previous coarse scan of the sample, an analysis of layout data of the sample, etc. The layout data of the sample may comprise feature information such as, fiduciary data, reference features, critical dimensions, etc. The layout data may comprise data stored in Graphic Database System (GDS) format, Graphic Database System II (GDS II) format, Common Intermediate Format (CIF), including a graphical representation of the features on the wafer surface, an Open Artwork System Interchange Standard (OASIS) format, among others. The wafer design layout may be based on a pattern layout for constructing the wafer. The wafer design layout may correspond to one or more photolithography masks or reticles used to transfer features from the photolithography masks or reticles to a wafer, for example. A GDS information file, OASIS information file, etc. may comprise feature information stored in a binary file format representing planar geometric shapes, text, and other information related to wafer design layout.

Database 901 may be configured to be updated manually or automatically. Database 901 may include, for example, Oracle™ databases, Sybase™ databases, relational databases, or non-relational databases, such as Hadoop™ sequence files, HBase™, or Cassandra™. Database 901 may include computing components (e.g., database management system, database server, etc.) configured to receive and process requests for data stored in memory devices of database 901 and to provide data from database 901. In some embodiments, database 901 may take the form of a server, a computer, a mainframe computer, or any combination of these components. Other implementations consistent with disclosed embodiments are possible as well.

In some embodiments, controller 902 may be configured to communicate and exchange information with database 901. Controller 902 may include a micro-processor 904 configured to communicate with drivers 920_1, 920_2 and 920_3, database 901, or other components. In particular, controller 902 may be further configured to acquire profile data from database 901. Controller 902 may store the acquired profile data temporarily to be shared with drivers or other components of steering architecture 900.

In some embodiments, controller 902 may be configured to control each deflector 950 by providing a steering signal (e.g., steering signal 905_1, 905_2, 905_3) to a corresponding driver based on the acquired profile data. Each steering signal may be configured to steer an individual corresponding beamlet. Although FIG. 9 shows only three drivers, three deflectors, three compensators, three amplifiers, etc., it is appreciated that steering architecture 900 may comprise any number of drivers, deflectors, compensators, etc. as appropriate.

In some embodiments, steering architecture 900 may comprise steering circuitry 960 including driver 920, corresponding compensator 930, and corresponding amplifier 940 for corresponding beamlet steering deflector 950. Steering circuit 960 may be configured to generate driving signal 925 based on the received steering signal 905, generate compensation signal 935 based on received driving signal 925 from corresponding driver 920 and other driving signals from neighboring drivers, and amplify compensated signal 935 to be provided to corresponding beamlet steering deflector 950.

As illustrated in FIG. 9, each beamlet steering deflector (e.g., deflector 950_3) is driven by a corresponding driver (e.g., driver 920_3), and each driver is configured to receive a steering signal (e.g., steering signal 905_3) from controller 902. Each driver 920 is configured to generate a driving signal 925, which is provided to a corresponding compensator 930. In some embodiments, compensator 930 may be configured to receive other driving signals from neighboring drivers. In a densely arranged array of drivers, the interaction between neighboring drivers may include overlapping electric fields, referred to herein as cross-talk. As a result of the cross-talk between neighboring drivers, the steering signal may need to be corrected based on the effect of the cross-talk.

In some embodiments, a beamlet may not be steered and the corresponding deflector may be deactivated. For example, beamlet passing through beamlet steering deflector 950_3 may be incident on a region of interest without steering. In such a case, driver 920_3, compensator 930_3, and amplifier 940_3 may be deactivated as well. This may further improve the beam usage efficiency and increase throughput.

In some embodiments, compensator 930 may be configured to compensate a corresponding deflector 950_3 based on the driving signal and other driving signals received from neighboring drivers. The amount of deflection of individual beamlets required to steer the beam to probe regions of interest may be a function of the trajectories of neighboring beamlets. Therefore, the correction or compensation may be determined based on the electric field strength of neighboring deflectors.

In some embodiments, amplifier 940 may be configured to amplify compensated signal 935 to be provided to corresponding beamlet steering deflector 950. In some instances, compensated signal 935 may not be amplified and can be directly applied to beamlet steering deflector 950. In some embodiments, the beamlet may not need to be steered and the steering circuit may be deactivated or turned off.

Figure 10:
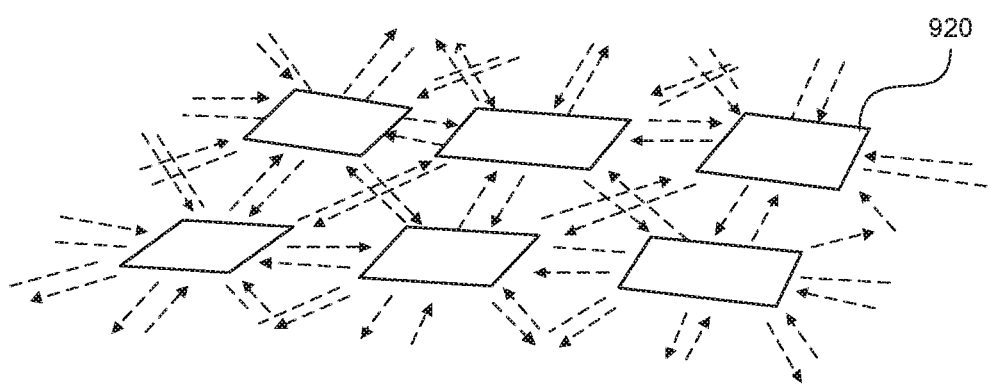
FIG. 10 shows a schematic representation of a 2D-grid of deflector drivers, consistent with embodiments of the present disclosure.

Reference is now made to FIG. 10, which illustrates a schematic representation of a two-dimensional grid of drivers 920, consistent with embodiments of the present disclosure. As described earlier, an increased density of drivers may cause cross-talk, affecting the determination of driving signal 925. As illustrated in FIG. 10, a densely arranged two-dimensional (2D) grid of drivers may cause a driver (e.g., driver 920) to influence and be influenced by its neighboring drivers. The dashed arrows in FIG. 10 indicate the mutual interaction between drivers in the 2D grid. This interaction may cause inaccuracies in calculation of the amount of deflection caused by the uncompensated driving signal, rendering the inspection or imaging inefficient. Compensator 930 of FIG. 9 may be configured to calculate the correction based on the electric field strength from neighboring drivers and deflectors. In some embodiments, the mutual interaction compensation may be applied to the drivers with a feedback mechanism. The calculation of compensation by compensator 930 may be an iterative feedback mechanism to adjust the amount of individual beamlet steering.

Figure 11:
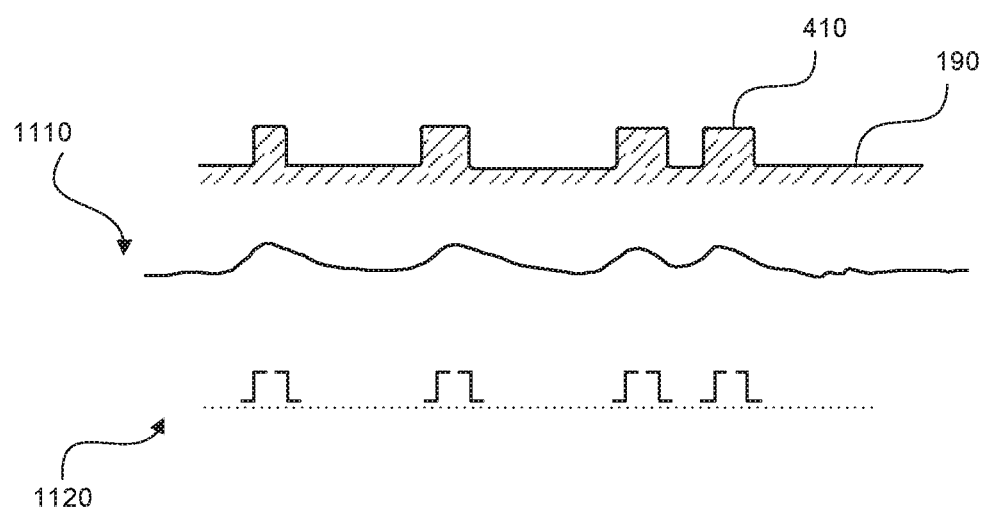
FIG. 11 illustrates a plot of surface topology and scanning plans highlighting the regions of interest, consistent with embodiments of the present disclosure.

Reference is now made to FIG. 11, which illustrates a plot of surface topology and scanning plans highlighting the regions of interest, consistent with embodiments of the present disclosure. Structures 410 may be formed on wafer 190 via photolithography techniques including deposition, etching, patterning, passivating, etc. Other known techniques to form patterns or structures on a wafer may be employed as well. In some embodiments, the pattern and layout of structures on wafer 190 may be known and the beamlets may be programmed to probe the regions of interest on those structures. For example, controller 902 of FIG. 9 may acquire pre-stored information related with structure layout from database 901. Database 901 may include information related with product design, process information, tolerances, dimensions, etc. to enable determining regions of interest prior to scanning wafer 190. Controller 902 may utilize this information to generate a pre-programmed scan of wafer including beamlet steering information based on the stored information. It is to be appreciated that the accuracy of individual beamlet steering may depend on accurate alignment and positioning of wafer 190. In some embodiments, the alignment of the wafer may be performed based on image data obtained using the multi-beam apparatus. The obtained image data may then be processed through an image processing application or a software to determine beamlet location and deflection information. The beamlet location and deflection information may be determined after the scanning has been performed or during image acquisition as well.

In some embodiments, the pattern and layout of structures 410 on wafer 190 may be determined by performing a low resolution, coarse scan of the sample to obtain coarse line profile 1110, as shown in FIG. 11. Coarse line profile 1110 may indicate presence of features and their locations, although not precisely. With the information obtained from coarse line profile 1110, it may be possible to approximately determine the edges of structure 410. Based on the information from coarse line profile 1110, a high resolution, fine scan of sample may then be performed to obtain fine line profile 1120. As shown in FIG. 11, fine line profile 1120 includes edges of structures 410 whereas the feature-less surface (e.g., surface 402 of FIG. 4) may not be scanned.

Figure 12:
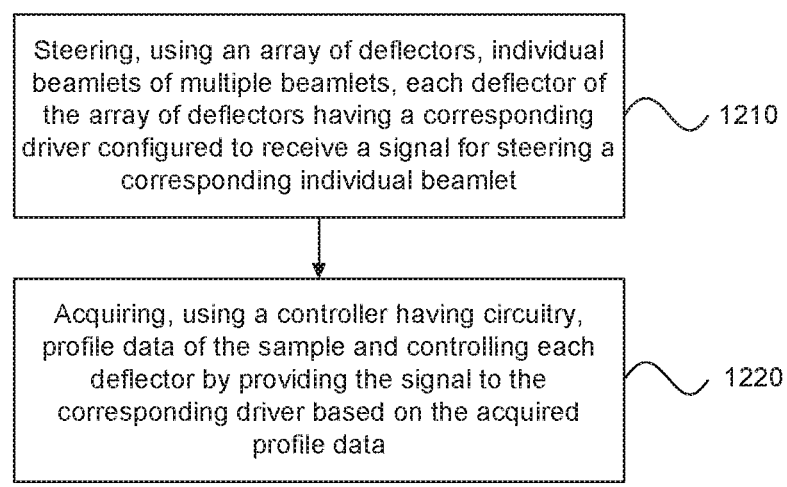
FIG. 12 is a flow chart showing an exemplary method of observing a sample using a multiple electron beam system, consistent with embodiments of the present disclosure.

FIG. 12 is a process flow chart of an exemplary method of observing a sample in a multi-beam apparatus (e.g., electron beam tool 100 of FIG. 1). The method may include steering individual beamlets independently, and acquiring profile data of the sample and controlling each deflector by providing the signal to the corresponding driver based on the acquired profile data.

In step 1210, an individual beamlet may be steered using a beamlet steering deflector (e.g., beamlet steering deflector 950 of FIG. 9). The beamlet steering deflector may be a part of an array of deflectors and each deflector of the array of deflectors may have a corresponding driver (e.g., driver 920_1 of FIG. 9) configured to receive a beamlet steering signal (e.g., steering signal 905_1 of FIG. 9). Each of the individual beamlets may be steered by a steering circuit (e.g., steering circuit 960 of FIG. 9) comprising a driver (e.g., driver 920_3 of FIG. 9), a compensator (e.g., compensator 930 of FIG. 9) and an amplifier (e.g., amplifier 940 of FIG. 9).

The steering circuit may be configured to generate a driving signal using a corresponding driver. In a multi-beam system designed to probe multiple spots with multi-beams, the density of beamlets to be individually steered may be high. The beamlets pass through the deflectors and get steered by a small but finite amount to probe only the regions of interest on wafer 190. Each of the deflectors may be driven by a corresponding driver, and therefore the number of deflectors equals the number of drivers. If the density of drivers in a two-dimensional array increases, the beam steering accuracy and reliability of the system may be compromised, because the electric field around each of the drivers may start overlapping and influencing the neighboring driving signals. This may be referred to as cross-talk between neighboring drivers. Each corresponding compensator receives the driving signal from a corresponding driver and a set of driving signals from other adjacent drivers associated with adjacent deflectors. The compensator may be configured to compensate a corresponding deflector based on the driving signal and other driving signals received from neighboring drivers. Compensator signal (e.g., compensator signal 935 of FIG. 9) may be amplified by the amplifier and the amplifier may provide the beamlet steering signal to deflector.

In step 1220, a controller (e.g., controller 902 of FIG. 9) may be configured to acquire profile data of wafer 190. Controller may be further configured to control each driver by providing the signal to the corresponding driver based on the profile data.

Controller may acquire profile data from a database (e.g., database 901 of FIG. 9). As described earlier database may be configured to store profile data of the sample (e.g., wafer 190). Profile data may comprise information related with, but not limited to, the layout, pitch, dimensions, positioning coordinates, shape, regions of interest, structure density, etc. Database 901 may be configured to be updated manually or automatically. Database 901 may include computing components (e.g., database management system, database server, etc.) configured to receive and process requests for data stored in memory devices of database 901 and to provide data from database 901. Based on the acquired profile data of the sample, the controller may generate steering signals to be provided to the driver.

In some embodiments, a system controller may be configured to control a charged particle beam system. The system controller may instruct components of the charged particle beam system to perform various functions, such as controlling a charged particle source to generate a charged particle beam, controlling a deflector to divert the trajectory of a beam, and controlling a scanning deflector to scan the charged particle beam across a sample. The system controller may comprise a storage that is a storage medium such as a hard disk, random access memory (RAM), other types of computer readable memory, and the like. The storage may be used for saving scanned raw image data as original images, and post-processed images. A non-transitory computer readable medium may be provided that stores instructions for a processor of controller 40 to carry out charged particle beam detection, sampling period determination, image processing, or other functions and methods consistent with the present disclosure. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

The embodiments may further be described using the following clauses:

1. A multi-beam apparatus comprising:
an array of deflectors configured to steer individual beamlets of multiple beamlets, each deflector of the array of deflectors having a corresponding driver configured to receive a signal for steering a corresponding individual beamlet; and
a controller having circuitry to acquire profile data of a sample and to control each deflector by providing the signal to the corresponding driver based on the acquired profile data.

2. The apparatus of clause 1, further comprising a steering circuitry for each deflector of the deflector array, the steering circuitry comprising:
the corresponding driver configured to generate a driving signal; and
a corresponding compensator configured to receive the driving signal and a set of driving signals from other adjacent drivers associated with adjacent deflectors and to generate a compensation signal to compensate a corresponding deflector based on the driving signal and the set of driving signals.

3. The apparatus of clause 2, wherein the steering circuitry further comprises a corresponding amplifier for each deflector of the deflector array, wherein the corresponding amplifier is configured to amplify the compensation signal to be provided to the corresponding deflector.

4. The apparatus of any one of the preceding clauses, wherein the profile data of the sample includes a region of interest.

5. The apparatus of clause 4, wherein the region of interest is identified based on a previous coarse scan of the sample.

6. The apparatus of clause 4, wherein the region of interest is identified based on an analysis of layout data of the sample.

7. The apparatus of clause 4, wherein the controller is configured to identify the region of interest from the profile data and to control the steering of at least one individual beamlet of the multiple beamlets to inspect the region of interest independent from the other beamlets of the multiple beamlets.

8. The apparatus of any one of the preceding clauses, wherein the profile data comprises as least one of data based on a previous inspection of the sample, scanned data of the sample, and image data.

9. The apparatus of any one of the preceding clauses, further comprising a current limiting aperture array disposed upstream from the array of deflectors.

10. A method of observing a sample in a multi-beam apparatus, the method comprising:
steering, using an array of deflectors, individual beamlets of multiple beamlets, each deflector of the array of deflectors having a corresponding driver configured to receive a signal for steering a corresponding individual beamlet;
acquiring, using a controller having circuitry, profile data of the sample; and
controlling each deflector by providing the signal to the corresponding driver based on the acquired profile data.

11. The method of clause 10, wherein controlling each deflector by providing the signal to the corresponding driver based on the acquired profile data further comprises:
generating, using the corresponding driver, a driving signal;
receiving, using a corresponding compensator, the driving signal and a set of driving signals from other drivers associated with adjacent deflectors;
generating, using the corresponding compensator, a compensation signal to compensate a corresponding deflector based on the driving signal and the set of driving signals.

12. The method of clause 11, further comprising amplifying, using a corresponding amplifier for each deflector of the deflector array the compensation signal to be provided to the corresponding deflector.

13. The method of any of the preceding clauses, wherein the profile data of the sample includes a region of interest.

14. The method of clause 13, wherein the region of interest is identified based on a previous coarse scan of the sample.

15. The method of clause 13, wherein the region of interest is identified based on an analysis of layout data of the sample.

16. The method of clause 13, wherein the controller is configured to identify the region of interest from the profile data and to control the steering of at least one individual beamlet of the multiple beamlets to inspect the region of interest independent from the other beamlets of the multiple beamlets.

17. The method of any of the preceding clauses, wherein the profile data comprises at least one of data based on a previous inspection of the sample, scanned data of the sample, and image data.

18. The method of any of the preceding clauses, wherein a current limiting aperture array is disposed upstream from the array of deflectors.

19. A non-transitory computer readable medium storing a set of instructions that is executable by one or more processors of a multi-beam apparatus to cause the multi-beam apparatus to perform a method to observe a sample, the method comprising:
steering, using an array of deflectors, individual beamlets of multiple beamlets, each deflector of the array of deflectors having a corresponding driver configured to receive a signal for steering a corresponding individual beamlet;
acquiring, using a controller having circuitry, profile data of the sample; and
controlling each deflector by providing the signal to the corresponding driver based on the acquired profile data.

20. The non-transitory computer readable medium of clause 19, wherein the set of instructions that is executable by one or more processors of a multi-beam apparatus cause a steering circuitry of the multi-beam apparatus to further perform:

generating a driving signal;

receiving the driving signal and a set of driving signals from other adjacent drivers associated with adjacent deflectors; and generating a compensation signal to compensate a corresponding deflector based on the driving signal and the set of driving signals.

21. The non-transitory computer readable medium of any one of clauses 19 and 20, wherein the set of instructions that is executable by one or more processors of a multi-beam apparatus cause a controller of the multi-beam apparatus to further perform:

identifying a region of interest from the profile data; and controlling the steering of at least one individual beamlet of the multiple beamlets to inspect the region of interest independent from the other beamlets of the multiple beamlets.

22. The apparatus of clause 4, wherein the region of interest is a particular portion of a feature on the sample.

23. The apparatus of clause 22, wherein the particular portion is an edge of the feature.

24. The non-transitory computer readable medium of clause 19, wherein the region of interest is a portion of a feature on the sample.

25. The non-transitory computer readable medium of clause 24, wherein the region of interest is identified based on a previous coarse scan of the sample, or an analysis of layout data of the sample.

Block diagrams in the figures may illustrate the architecture, functionality, and operation of possible implementations of systems, methods, and computer hardware/software products according to various exemplary embodiments of the present disclosure. In this regard, each block in a schematic diagram may represent certain arithmetical or logical operation processing that may be implemented using hardware such as an electronic circuit. Blocks may also represent a module, segment, or portion of code that comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the present invention is not limited to the exact construction that has been described above and illustrated in the accompanying drawings, and that various modifications and changes can be made without departing from the scope thereof.

The invention claimed is:

1. A multi-beam apparatus comprising:
an array of deflectors configured to steer individual beamlets of multiple beamlets, each deflector of the array of deflectors having a corresponding driver configured to receive a signal for steering a corresponding individual beamlet; and
a controller having circuitry configured to acquire profile data of a sample and to control each deflector by providing the signal to the corresponding driver based on the acquired profile data.

2. The apparatus of claim 1, further comprising a steering circuitry for each deflector of the deflector array, the steering circuitry comprising:
the corresponding driver configured to generate a driving signal; and
a corresponding compensator configured to receive the driving signal and a set of driving signals from adjacent drivers associated with adjacent deflectors and to generate a compensation signal to compensate a corresponding deflector based on the driving signal and the set of driving signals.

3. The apparatus of claim 2, wherein the steering circuitry further comprises a corresponding amplifier for each deflector of the deflector array, wherein the corresponding amplifier is configured to amplify the compensation signal to be provided to the corresponding deflector.

4. The apparatus of claim 1, wherein the acquired profile data of the sample includes a region of interest.

5. The apparatus of claim 4, wherein the region of interest is a particular portion of a feature on the sample.

6. The apparatus of claim 5, wherein the particular portion is an edge of the feature.

7. The apparatus of claim 4, wherein the region of interest is identified based on a previous coarse scan of the sample.

8. The apparatus of claim 4, wherein the region of interest is identified based on an analysis of layout data of the sample.

9. The apparatus of claim 4, wherein the controller is configured to identify the region of interest from the acquired profile data and to control the steering of at least one individual beamlet of the multiple beamlets to inspect the region of interest independent from the other beamlets of the multiple beamlets.

10. The apparatus of claim 1, wherein the acquired profile data comprises as least one of data based on a previous inspection of the sample, scanned data of the sample, and image data.

11. A non-transitory computer readable medium storing a set of instructions that is executable by one or more processors of a multi-beam apparatus to cause the multi-beam apparatus to perform a method to observe a sample, the method comprising:
steering, using an array of deflectors, individual beamlets of multiple beamlets, each deflector of the array of deflectors having a corresponding driver configured to receive a signal for steering a corresponding individual beamlet;
acquiring, using a controller having circuitry, profile data of the sample; and
controlling each deflector by providing the signal to the corresponding driver based on the acquired profile data.

12. The non-transitory computer readable medium of claim 11, wherein the set of instructions that is executable by one or more processors of a multi-beam apparatus cause a steering circuitry of the multi-beam apparatus to further perform:
generating a driving signal;
receiving the driving signal and a set of driving signals from adjacent drivers associated with adjacent deflectors; and
generating a compensation signal to compensate a corresponding deflector based on the driving signal and the set of driving signals.

13. The non-transitory computer readable medium of claim 11, wherein the set of instructions that is executable by one or more processors of a multi-beam apparatus cause a controller of the multi-beam apparatus to further perform:

identifying a region of interest from the acquired profile data; and controlling the steering of at least one individual beamlet of the multiple beamlets to inspect the region of interest independent from the other beamlets of the multiple beamlets.

14. The non-transitory computer readable medium of claim 13, wherein the region of interest is a portion of a feature on the sample.

15. The non-transitory computer readable medium of claim 13, wherein the region of interest is identified based on a previous coarse scan of the sample or an analysis of layout data of the sample.

\* \* \* \* \*